US008944580B2

(12) United States Patent
Ikegame et al.

(10) Patent No.: US 8,944,580 B2
(45) Date of Patent: Feb. 3, 2015

(54) PHOTOSENSITIVE RESIN COMPOSITION, METHOD FOR MANUFACTURING STRUCTURAL BODY, AND LIQUID DISCHARGE HEAD

(75) Inventors: Ken Ikegame, Atsugi (JP); Masako Shimomura, Yokohama (JP); Hyo Takahashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 389 days.

(21) Appl. No.: 13/510,609

(22) PCT Filed: Jan. 31, 2011

(86) PCT No.: PCT/JP2011/052457
§ 371 (c)(1),
(2), (4) Date: May 17, 2012

(87) PCT Pub. No.: WO2011/096552
PCT Pub. Date: Aug. 11, 2011

(65) Prior Publication Data
US 2012/0229556 A1 Sep. 13, 2012

(30) Foreign Application Priority Data

Feb. 5, 2010 (JP) .................................. 2010-024683

(51) Int. Cl.
*C09D 11/00* (2014.01)
*G03F 7/004* (2006.01)
(Continued)

(52) U.S. Cl.
CPC .............. *G03F 7/0045* (2013.01); *C08G 59/68* (2013.01); *C08G 65/105* (2013.01); *C08G 65/18* (2013.01); *G03F 7/038* (2013.01); *C08L 31/06* (2013.01); *G03F 7/0046* (2013.01)
USPC ......................................................... 347/100

(58) Field of Classification Search
USPC ......................................................... 347/100
See application file for complete search history.

(56) References Cited

U.S. PATENT DOCUMENTS 7,850,296 B2   12/2010   Shimomura et al.
8,157,347 B2    4/2012   Inamoto et al.
(Continued)

FOREIGN PATENT DOCUMENTS

JP  2008-20841 A  1/2008
JP  2008-65161 A  3/2008
(Continued)

OTHER PUBLICATIONS

Chinese Office Action dated Feb. 24, 2014 in Chinese Application No. 201180008169.6.
(Continued)

*Primary Examiner* — Laura Martin
(74) *Attorney, Agent, or Firm* — Fitzpatrick, Cella, Harper and Scinto (57) ABSTRACT

A photosensitive resin composition includes: a cation polymerizable compound; a photoacid generator having an anion portion represented by the chemical formula 1 and a cation portion, (Chemical Formula 1)

$$(R-Y)_m-X^--(F)_n$$

wherein R represents a hydrocarbon group which may be substituted with a fluorine atom and has a total carbon number of 1 to 30; X is selected from the group consisting of a carbon atom and a phosphorous atom; Y is selected from the group consisting of $-S(=O)_2-$, $-O-CF_2-$, $-C(=O)-CF_2-$, $-O-C(=O)-CF_2-$, $-C(=O)-O-CF_2-$, and a single bond; R has at least one fluorine atom when Y is $-S(=O)_2-$ or the single bond; m and n are integers selected from the group consisting of m+n=3 and n=0, 1, and 2 when X is the carbon atom; m and n are integers selected from the group consisting of m+n=6 and n=0 to 5 when X is the phosphorous atom; and R and Y may be different from each other when m is equal to or greater than 2; and a salt of an anion portion and a cation portion, wherein an acid strength of an acid derived from the anion portion is equal to or greater than that of hexafluorophosphoric acid and equal to or less than that of hexafluoroantimonic acid.

15 Claims, 3 Drawing Sheets

(51) Int. Cl.
*C08G 59/68* (2006.01)
*C08G 65/10* (2006.01)
*C08G 65/18* (2006.01)
*G03F 7/038* (2006.01)
*C08L 31/06* (2006.01)

(56) References Cited

U.S. PATENT DOCUMENTS

| | | | |
|---|---|---|---|
| 2004/0072107 | A1 | 4/2004 | Kubota et al. |
| 2006/0071971 | A1 | 4/2006 | Mori |
| 2008/0291234 | A1* | 11/2008 | Shimomura et al. ............ 347/20 |
| 2008/0311511 | A1 | 12/2008 | Senzaki et al. |
| 2011/0139330 | A1 | 6/2011 | Ikegame et al. |
| 2011/0267403 | A1* | 11/2011 | Shimomura et al. ............ 347/44 |
| 2012/0115089 | A1 | 5/2012 | Ishizuka et al. |
| 2012/0115985 | A1 | 5/2012 | Ishizuka et al. |

FOREIGN PATENT DOCUMENTS

| | | |
|---|---|---|
| JP | 2008-256980 A | 10/2008 |
| JP | 2009-244779 A | 10/2009 |
| WO | 2010/001919 A1 | 1/2010 |

OTHER PUBLICATIONS

PCT International Search Report and Written Opinion of the International Searching Authority, International Application No. PCT/JP2011/052457, Mailing Date Mar. 29, 2011.

* cited by examiner

PHOTOSENSITIVE RESIN COMPOSITION, METHOD FOR MANUFACTURING STRUCTURAL BODY, AND LIQUID DISCHARGE HEAD

TECHNICAL FIELD

The present invention relates to a negative photosensitive resin composition. Specifically, the present invention relates to a negative photosensitive resin composition which is suitable and can be used for manufacturing a liquid discharge head for generating droplets such as ink small droplets used for a liquid discharge recording system. The present invention relates to a liquid discharge head using the negative photosensitive resin composition.

BACKGROUND ART

A photolithography technique has been heretofore known as one of microfabrication techniques. In the photolithography technique, a negative photosensitive resin is exposed and developed to form a pattern and a structure. This technique is widely used in manufacture applications such as a semiconductor integrated circuit, a semiconductor exposing mask, and various MEMS (Micro ElectroMechanical Systems). The technique is applied to manufacture a nozzle of a liquid discharge head, as an example of the manufacture applications of the MEMS. For example, a stepper having an i-line as a light source is widely used as an exposing device. In this technical field, recently, manufacture of a more complex and high-definition structure object has been required. Therefore, a negative photosensitive resin composition exhibiting high photosensitivity and molding accuracy to light from a light source has been required.

Japanese Patent Application Laid-Open No. 2008-256980 discloses a photosensitive resin composition containing a polyfunctional epoxy resin and a photoacid generator, as an example of the negative photosensitive resin compositions. An acid derived from an anion portion structure of the photoacid generator used herein has a strong acid strength, and improve sensitivity of the photosensitive resin composition compared with hexafluoroantimonic acid.

US 2004/0072107 A1 and US 2006/0071971 A1 disclose a liquid discharge head and a manufacturing method thereof as an example of the liquid discharge heads. The liquid discharge head heats a heating resistor to foam ink, thereby discharging ink droplets. In the manufacture of the liquid discharge head, high temperature processing is conducted at 200° C. in a curing process of a photosensitive resin composition.

CITATION LIST

Patent Literature

PTL 1: Japanese Patent Application Laid-Open No. 2008-256980
PTL 2: US 2004/0072107 A1
PTL 3: US 2006/0071971 A1

SUMMARY OF INVENTION

As described above, a cured product of the negative photosensitive resin composition may be heat-treated at 200° C. or higher in the method for manufacturing the liquid discharge head. When a liquid discharge head was manufactured using a photosensitive resin composition containing a photoacid generator having a hexafluoroantimonic acid structure as an anion portion, the deterioration of a resin cured product was not observed even if the cured product was heat-treated. However, when the photoacid generator described in Japanese Patent Application Laid-Open No. 2008-256980 is used in order to achieve higher photosensitivity and molding accuracy, the resin cured product is deteriorated to cause a problem that resistance to the ink is reduced. Thus, the use of the negative photosensitive resin composition described in Japanese Patent Application Laid-Open No. 2008-256980 for the liquid discharge head may cause a problem of heat resistance.

Therefore, it is an object of the present invention to provide a negative photosensitive resin composition having high sensitivity, good molding accuracy and high heat resistance. It is another object of the present invention to obtain a liquid discharge head having a flow path forming layer formed using the negative photosensitive resin composition.

A photosensitive resin composition as an example of the present invention includes:

a cation polymerizable compound;

a photoacid generator having an anion portion represented by the chemical formula 1 and a cation portion, (Chemical Formula 1)

wherein R represents a hydrocarbon group which may be substituted with a fluorine atom and has a total carbon number of 1 to 30; X is selected from the group consisting of a carbon atom and a phosphorous atom; Y is selected from the group consisting of —S(=O)$_2$—, —O—CF$_2$—, —C(=O)—CF$_2$—, —O—C(=O)—CF$_2$—, —C(=O)—O—CF$_2$—, and a single bond; R has at least one fluorine atom when Y is —S(=O)$_2$— or the single bond; m and n are integers selected from the group consisting of m+n=3 and n=0, 1, and 2 when X is the carbon atom; m and n are integers selected from the group consisting of m+n=6 and n=0 to 5 when X is the phosphorous atom; and R and Y may be different from each other when m is equal to or greater than 2; and a salt of an anion portion and a cation portion, wherein an acid strength of an acid derived from the anion portion is equal to or greater than that of hexafluorophosphoric acid and equal to or less than that of hexafluoroantimonic acid.

The present invention can provide a negative photosensitive resin composition which enables patterning with high sensitivity and good molding accuracy, is adaptable even to a high temperature process, and has high heat resistance.

Further features of the present invention will become apparent from the following description of exemplary embodiments with reference to the attached drawings.

DESCRIPTION OF EMBODIMENTS

Each of components of a photosensitive resin composition according to the present invention will be described in detail.

<Acid-Polymerizable Compound>

An acid-polymerizable compound is not particularly limited but may be, for example, a compound having one or more reactive functional groups selected from the group consisting of an epoxy group, an oxetane group, a vinyl ether group, and a propenyl ether group.

Of these, a polyfunctional epoxy resin having a plurality of epoxy groups included in one molecule can be used. Examples of the polyfunctional epoxy resin include a polyfunctional alicyclic epoxy resin, a polyfunctional phenol novolak epoxy resin, a polyfunctional o-cresol novolak epoxy resin, a polyfunctional triphenyl novolak epoxy resin, and a polyfunctional bisphenol A novolak epoxy resin. Of these, the polyfunctional bisphenol A novolak epoxy resin and the polyfunctional epoxy resin having an alicyclic skeleton be desirably used. Desirably, the epoxy resins have functionality of five or greater functions. For example, "157S70" manufactured by Japan Epoxy resins Co., Ltd., "EPICLON N-865" manufactured by Dainippon Ink and Chemicals Inc., and "EHPE-3150" manufactured by Daicel Chemical Industries, Ltd. are available as commercial items, and are particularly desirably used.

The softening point of the above-described polyfunctional epoxy resin is not particularly limited but is desirably 50 to 180° C. and more desirably 60° C. to 160° C.

The content of the above-described polyfunctional epoxy resin in the composition is desirably 40% by mass to 99.9% by mass, more desirably 45% by mass to 99.9% by mass, and still more desirably 50% by mass to 99.2% by mass. Thereby, when the photosensitive resin composition is applied to a support, a resist layer having appropriate hardness is obtained.

Any compound having at least one oxetane ring can be used as the compound having an oxetane group. Examples of the compound having an oxetane group include a bisphenol A oxetane compound, a bisphenol oxetane compound, a bisphenol S oxetane compound, a xylylene oxetane compound, a phenol-novolak oxetane compound, a cresol-novolak oxetane compound, an alkylphenol-novolak oxetane compound, a biphenol oxetane compound, a bixylenol oxetane compound, a naphthalene oxetane compound, a dicyclopentadiene oxetane compound, and an oxetane-containing product of a condensate of phenols and an aromatic aldehyde having a phenolic hydroxyl group.

More specifically, compounds described in the following chemical formulae are exemplified as the compound having an oxetane group.

n = 3 n is an interger of 1 to 20

Examples of the compound having a vinyl ether (hereinafter, abbreviated as VE) group include monofunctional VEs [carbon atoms of equal to or greater than 3 and a number average molecular weight of equal to or less than 1,000, for example, alkyl VEs [methyl VE, ethyl VE, butyl VE, isobutyl VE, cyclohexyl VE, 2-chloroethyl VE, 2-phenoxyethyl VE, 2-hydroxyethyl VE, 4-hydroxybutyl VE, stearyl VE, 2-acetoxyethyl VE, diethylene glycol mono-VE, 2-ethylhexyl VE, dodecyl VE, and octadecyl VE], alkenyl VEs [allyl VE, 2-methacroyloxyethyl VE, and 2-acroyloxyethyl VE], aryl VEs [phenyl VE and p-methoxyphenyl VE], and polyfunctional VEs [carbon atoms of equal to or greater than 6 and a number average molecular weight of equal to or less than 1,000, for example, 1,4-butane diol di-VE, triethylene glycol di-VE, 1,4-benzene di-VE, hydroquinone di-VE, cyclohexanedimethanol di-VE, diethylene glycol di-VE, dipropylene di-VE, and hexanediol di-VE].

Examples of the compound having a propenyl ether (hereinafter, abbreviated as PPE) group include monofunctional PPEs [carbon atoms of equal to or greater than 4 and a number average molecular weight of equal to or less than 1,000, for example, alkyl PPEs [methyl PPE, ethyl PPE, butyl PPE, isobutyl PPE, cyclohexyl PPE, 2-chloroethyl PPE, 2-phenoxyethyl PPE, 2-hydroxyethyl PPE, 4-hydroxybutyl PPE, stearyl PPE, 2-acetoxyethyl PPE, diethylene glycol mono-PPE, 2-ethylhexyl PPE, dodecyl PPE, and octadecyl PPE], alkenyl PPEs [allyl PPE, 2-methacroyloxyethyl PPE and 2-acroyloxyethyl PPE], aryl PPEs [phenyl PPE and p-methoxyphenyl PPE], and polyfunctional PPEs [carbon atoms of equal to or greater than 6 and a number average molecular weight of equal to or less than 1,000, for example, 1,4-bu- tanediol di-PPE, triethylene glycol di-PPE, 1,4-benzene di-PPE, hydroquinone di-PPE, cyclohexanedimethanol di-PPE, diethylene glycol di-PPE, dipropylene di-PPE, and hexanediol di-PPE].

<Photoacid Generator>

A photoacid generator includes a combination of a cation portion structure and an anion portion structure. Generally, the photoacid generator is irradiated with light of a wavelength exposing the photoacid generator, to cause structural changes such as decomposition of a cation portion, thereby generating an acid derived from an anion portion. The action of the generated acid initiates a polymerization reaction of a resin to enable the promotion of the reaction.

In order to obtain high sensitivity in the present invention, there is used a first photoacid generator, wherein an acid derived from an anion portion structure has an acid strength stronger than that of hexafluoroantimonic acid. The anion portion structure of the first photoacid generator is represented by the following chemical formula 1.

(Chemical Formula 1)

R represents a hydrocarbon group which may be substituted with a fluorine atom and has a total carbon number of 1 to 30. X is selected from the group consisting of a carbon atom and a phosphorous atom. Y is selected from the group consisting of —S(=O)$_2$—, —O—CF$_2$—, —C(=O)—CF$_2$—, —O—C(=O)—CF$_2$—, —C(=O)—O—CF$_2$—, and a single bond. R has at least one fluorine atom when Y is —S(=O)$_2$— or the single bond. m and n are integers selected from the group consisting of m+n=3 and n=0, 1, and 2 when X is the carbon atom. m and n are integers selected from the group consisting of m+n=6 and n=0 to 5 when X is the phosphorous atom. R and Y may be different from each other when m is equal to or greater than 2.

In the present invention, there is also used a second photoacid generator, wherein an acid derived from an anion portion structure has an acid strength of equal to or less than that of hexafluoroantimonic acid.

In the present invention, the inclusion of the first photoacid generator generates a strong acid to improve the sensitivity of the resin composition. The generated strong acid is converted into a weaker acid and a stable salt using the second photoacid generator (see the following formula 1) to improve heat resistance of a cured product. Hereinafter, the acid derived from the anion portion structure of the first photoacid generator is also referred to as a first acid. The acid derived from the anion portion structure of the second photoacid generator is also referred to as a second acid.

The stable salt means that a salt compound M$^-$/A$^+$ formed after the first acid which is a strong acid is trapped by the unreacted second photoacid generator is chemically stable. The cured product is not substantially deteriorated by the salt in a heating process. Since an acid (N$^-$/H$^+$ in the formula 1) derived from the anion portion structure generated by salt interchange has an acid strength equivalent to or weaker than that of hexafluoroantimonic acid, the second photoacid generator used in the present invention does not deteriorate the cured product of the photosensitive resin composition. In the present invention, presence of the strong acid which deteriorates the cured product can be reduced, and the heat resistance of the cured product can be improved.

Hereinafter, a reaction represented by a reaction formula of <the formula 1> will be described.

(Formula 1)

M$^-$/S$^+$ shows the first photoacid generator. hv shows a process irradiating with energy light. M$^-$/H$^+$ shows the acid (the first acid) generated from the first photoacid generator after exposing. N$^-$/A$^+$ shows the second photoacid generator. The present invention has the relationship of an acid strength of M$^-$/H$^+$> an acid strength of N$^-$/H$^+$. That is, in the formula 1, M$^-$/H$^+$ and N$^-$/H$^+$ are respectively mentioned as the strong acid and a weak acid for descriptive purposes.

A unit having minus sign represents the anion portion. A unit having plus sign represents the cation portion. That is, this means that the first photoacid generator and the second photoacid generator in the formula 1 are a one-to-one counter ion salt of the anion portion and the cation portion.

For example, when the first acid M$^-$/H$^+$ which is the generated strong acid meets with the unreacted (undecomposed) second photoacid generator N$^-$/A$^+$ in PEB (Post Exposure Bake) which is a process diffusing a generating acid to form an image and in a heat-treating (post-baking) process after developing, the first acid M$^-$/H$^+$ is converted into the weak acid N$^-$/H$^+$ and M$^-$/A$^+$.

This is a phenomenon generally referred to as salt interchange in the chemistry field.

Herein, the present invention is described using specific examples. However, the following specific examples do not limit the present invention. The following one example can be exemplified as a polyfunctional epoxy resin (A-1), a first photoacid generator (B-1) and a second photoacid generator (C-1) in the following description.

(A-1): EHPE 3150 (trade name, manufactured by Daicel Chemical Industries, Ltd.)

(B-1): GSID 26-1 (trade name, manufactured by Ciba Japan K.K)

(C-1): SP172 (trade name, manufactured by ADEKA Corporation)

Chemical Formula of (B-1)

Chemical Formula of (C-1)

Figure 5:
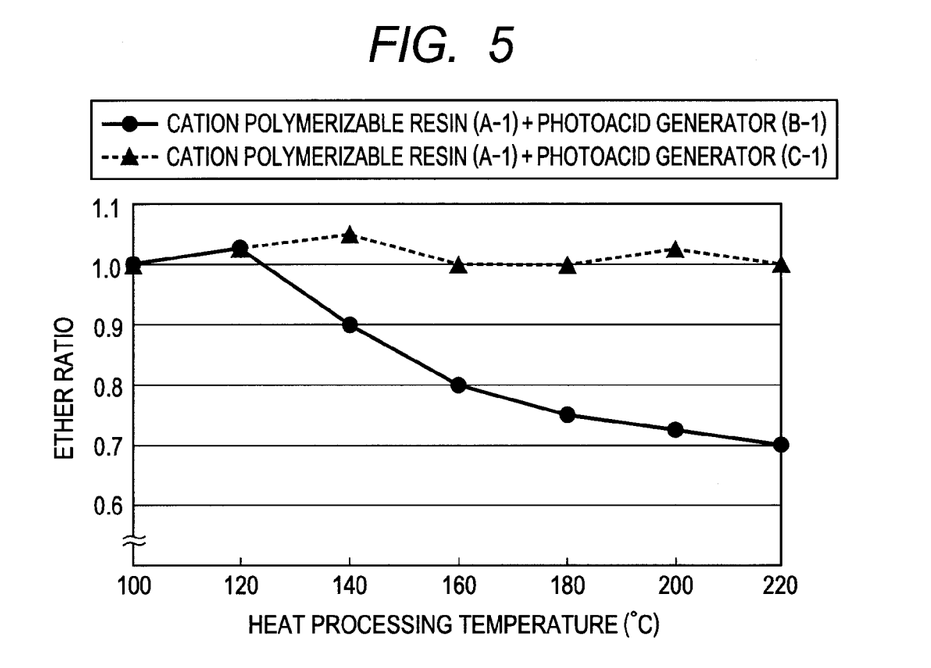
FIG. 5 is a graph showing the relationship between heat processing and a residual ether ratio in a cured product of a negative photosensitive resin composition containing one kind of photoacid generator.

FIG. 5 shows a graph representing, with an image, the relationship between a heat processing temperature and a residual ether ratio of a surface of a resin layer in a system of a negative photosensitive resin composition containing one kind of photoacid generator. This graph represents variation in number of residual ethers of the surface of the resin layer when the resin composition containing one kind of photoacid generator is applied on a substrate, and is exposed, developed and heat-treated. In FIG. 5, a negative photosensitive resin composition containing the polyfunctional epoxy resin (A-1) and the first photoacid generator (B-1), and a negative photosensitive resin composition containing the polyfunctional epoxy resin (A-1) and the second photoacid generator (C-1) are shown. The number of ethers is represented by a ratio of ether-derived peak intensity to reference peak intensity when the negative photosensitive resin compositions are measured by FT-IR.

FIG. 5 shows that the number of the residual ethers of the surface of the resin layer decreases according to the heat processing temperature in the negative photosensitive resin composition containing the polyfunctional epoxy resin (A-1) and the first photoacid generator (B-1). This shows that the polyfunctional epoxy resin (A-1) has an acid-decomposable ether bond included in a main chain, and an acid having an acid strength greater than that of hexafluoroantimonic acid generated from the photoacid generator oxidatively decomposes the ether bond of the main chain during heat processing to generate a polar group.

On the other hand, the number of ethers of the surface of the resin layer does not decrease during heat processing in the negative photosensitive resin composition containing the polyfunctional epoxy resin (A-1) and the second photoacid generator (C-1). This shows that even the polyfunctional epoxy resin having an acid-decomposable bond contained in the main chain is not oxidatively decomposed by hexafluoroantimonic acid. That is, this suggests that hexafluoroantimonic acid can be used as the basis of an acid strength for oxidatively decomposing resins such as the polyfunctional epoxy resin.

Figure 6:
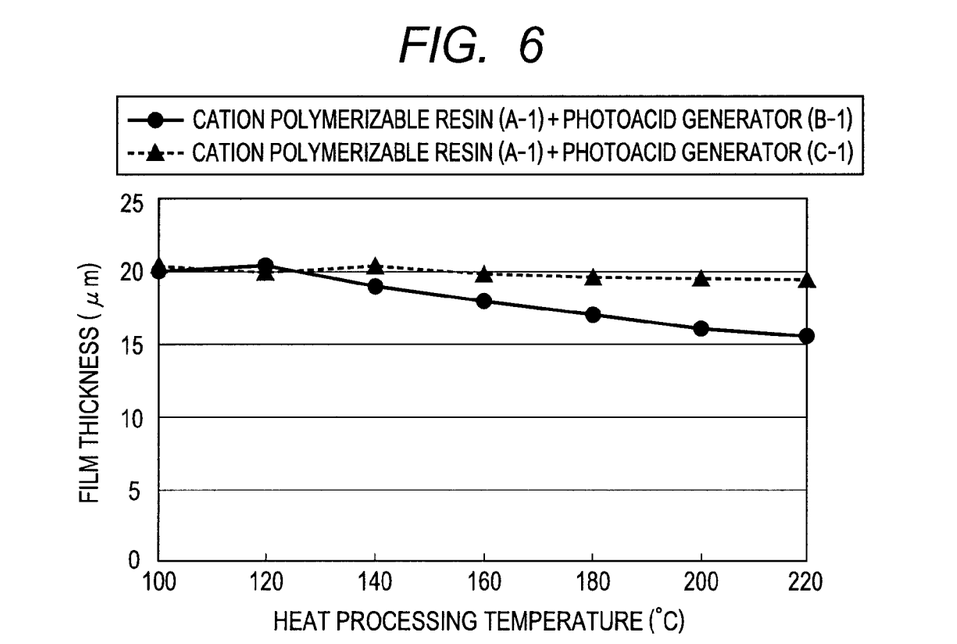
FIG. 6 is a graph showing the relationship between heat processing and a film thickness in the cured product of the negative photosensitive resin composition containing one kind of photoacid generator.

Then, FIG. 6 shows a graph showing the correlation between the heat processing temperature of the resin layer and a film thickness in the system of the negative photosensitive resin composition containing one kind of photoacid generator. The film thickness of the resin layer before heat processing was 20 μm.

FIGS. 5 and 6 show that the film thickness of the resin is reduced as the number of the residual ethers of the surface of the resin layer is decreased in the negative photosensitive resin composition containing the polyfunctional epoxy resin (A-1) and the first photoacid generator (B-1). That is, this shows that not only the ether bond of the surface of the resin layer but also the ether bond in the resin layer are decomposed. Furthermore, heat resistance is disadvantageously insufficient. For example, adhesion between a resin layer and a substrate is reduced by conducting high-temperature heating of 160° C. or higher when the negative photosensitive resin composition containing only one kind of first photoacid generator (B-1) is used for a liquid discharge head.

Therefore, in the present invention, the sensitivity of the resin can be improved by containing the first photoacid generator to generate the first acid as the strong acid, and the heat resistance of the cured product can be improved by converting the generated first acid into the weaker acid and the stable salt using the second photoacid generator.

The epoxy resin having an ether bond contained in the main chain after being cured was used as an example in the above-described specific description. However, the present invention is not limited thereto. When the high-temperature heating is conducted in the presence of the strong acid, an internal bond of most resins is considered to be decomposed. In the present invention, such decomposition can be prevented by converting the strong acid generated from the first photoacid generator into the stable salt and the weaker acid using the second photoacid generator. Therefore, any acid-polymerizable compound can be used as the resin without being particularly limited. Examples of the acid-polymerizable compound include a compound having an oxetane group, a compound having a vinyl ether group, and a compound having a propenyl ether group as described above in addition to the compound having an epoxy group.

Hereinafter, the first photoacid generator and the second photoacid generator will be described in detail.

<First Photoacid Generator>

Preferred specific examples of the anion portion structure in the first photoacid generator will be listed in the following chemical formula 3.

(Chemical Formula 3)

(b2-1)

(b2-2)

(b2-3)

(b2-12)

(b2-13)

(b2-14)

(b2-15)

(b2-16)

(b2-17)

Although the cation portion structure used for the first photoacid generator of the present invention is not particularly limited, a structure shown in the following chemical formula 4 is preferable in view of improvement in sensitivity.

(Chemical Formula 4)

In the chemical formula 4, $R_1$ to $R_3$ represent an aryl group having a total carbon number of 6 to 30, a heterocyclic group having a total carbon number of 4 to 30, an alkyl group having a total carbon number of 1 to 30, an alkenyl group having a total carbon number of 2 to 30, or an alkynyl group having a total carbon number of 2 to 30. These may be substituted with at least one selected from the group consisting of an alkyl group, a hydroxy group, a cycloalkyl group, an alkenyl group, an alkynyl group, an alkoxy group, an alkylcarbonyl group, an arylcarbonyl group, a alkoxycarbonyl group, an aryl oxycarbonyl group, an aryl thiocarbonyl group, an acyloxy group, an arylthio group, an alkylthio group, an aryl group, a hetero atom-containing aromatic ring group, an aryloxy group, an alkylsulfinyl group, an arylsulfinyl group, an alkylsulfonyl group, an arylsulfonyl group, an alkyleneoxy group, an amino group, a cyano group, a nitro group, and a halogen atom. More specifically, examples of these substituent groups include an alkyl group having 1 to 6 carbon atoms (for example, a methyl group, an ethyl group, a propyl group, an isopropyl group, a butyl group), a hydroxy group, a cycloalkyl group having 3 to 6 carbon atoms (for example, a cyclopropyl group, a cyclobutyl group, a cyclopentyl group, a cyclohexyl group), an alkenyl group having 2 to 6 carbon atoms (for example, a vinyl group, a 1-propenyl group, a

2-propenyl group, a 2-butenyl group), an alkynyl group having 2 to 6 carbon atoms (for example, an acetylenyl group, a 1-propynyl group, a 2-propynyl group, a 2-butynyl group), an alkoxy group having 1 to 6 carbon atoms (for example, a methoxy group, an ethoxyl group, an n-propoxy group, an iso-propoxy group, an n-butoxy group, a tert-butoxy group), an alkylcarbonyl group having 2 to 6 carbon atoms, an arylcarbonyl group having 7 to 11 carbon atoms, an alkoxycarbonyl group having 2 to 6 carbon atoms (for example, a methoxycarbonyl group, an ethoxycarbonyl group, a tert-butoxycarbonyl group), an aryl oxycarbonyl group having 7 to 11 carbon atoms, an aryl thiocarbonyl group having 7 to 11 carbon atoms, an acyloxy group having 2 to 6 carbon atoms, an arylthio group having 6 to 10 carbon atoms (for example, a phenylthio group, a naphthylthio group), an alkylthio group having 1 to 6 carbon atoms (for example, a methylthio group, an ethylthio group, an n-propylthio group, an iso-propylthio group, an n-butylthio group, a tert-butylthio group), an aryl group having 6 to 14 carbon atoms (for example, a phenyl group, a naphthyl group and an anthracenyl group), a hetero atom-containing aromatic ring group having 4 to 8 carbon atoms (for example, a furyl group and a thienyl group), an aryloxy group having 6 to 10 carbon atoms (for example, a phenoxy group and a naphthoxy group), an alkylsulfinyl group having 1 to 6 carbon atoms, an arylsulfinyl group having 6 to 10 carbon atoms, an alkylsulfonyl group having 1 to 6 carbon atoms, an arylsulfonyl group having 6 to 10 carbon atoms, an alkyleneoxy group having 1 to 6 carbon atoms, an amino group, a cyano group, a nitro group, and a halogen atom (for example, a chlorine atom, a bromine atom, a fluorine atom). Desirably, $R_1$ to $R_3$ have at least two oxygen atoms included in the total component atoms. $R_1$ to $R_3$ may be the same or different from each other. In $R_1$ to $R_3$, at least two Rs may be directly bonded to each other, or be bonded via —O—, —S—, —SO—, —SO$_2$—, —NH—, —NR$_4$—, —CO—, —C(=O)O—, —C(=O)NH—, and an alkylene group or a phenylene group having 1 to 3 carbon atoms, to form a ring structure, wherein $R_4$ is an alkyl group having 1 to 5 carbon atoms or an aryl group having 6 to 10 carbon atoms.

Preferred specific examples of the cation portion structure will be shown in the following chemical formula 5.

(Chemical Formula 5)

(b1-1)

(b1-2)

(b1-3)

(b1-4)

(b1-5)

(b1-6)

(b1-7)

(b1-8)

(b1-9)

(b1-10)

-continued (b1-11)
(b1-12)
(b1-13)
(b1-14)
(b1-15)
(b1-16)

When, for example, an i-line is used as an exposing wavelength, an example of the cation portion structure contained in the first photoacid generator is listed in the following chemical formula 6 (b1). Since the cation portion structure (b1) contains many oxygen atoms which constitute an electron-donating group, the cation portion structure (b1) can lengthen the absorption wavelength of the photoacid generator and has i-line photosensitivity.

An example of the anion portion structure contained in the first photoacid generator is listed in the following chemical formula 6 (b2). An acid derived from the anion portion structure (b2) has an acid strength (an acid strength stronger than that of hexafluoroantimonic acid) sufficiently curing an acid-polymerizable resin (for example, an epoxy resin).

(Chemical Formula 6)

An example of (b1)

An example of (b2)

The content of the first photoacid generator in the composition is generally 0.01 to 20% by mass, desirably 0.1 to 15% by mass, and more desirably 0.15 to 10% by mass.

<Second Photoacid Generator>

A second photoacid generator wherein an acid strength of an acid derived from an anion portion structure is equal to or less than that of hexafluoroantimonic acid can be selected.

The acid strength of equal to or less than that of hexafluoroantimonic acid means that a Hammett acidity function H0 is equal to or less than 18, when the compound is a Lewis acid. On the other hand, when the compound is a Broensted acid, the acid strength is desirably equal to or less than that of nonafluorobutane sulfonic acid. That is, PKa is desirably equal to or greater than −3.57.

For example, the anion portion structure producing an acid having an acid strength of equal to or less than that of hexafluoroantimonic acid can be exemplified as follows.

(c-1)

(c-2)

(c-3)

(c-4)

(c-5)

As described above, for example, a salt interchange reaction between the second photoacid generator and the first acid derived from the anion portion structure generated from the first photoacid generator in the PEB process is considered to occur. The acid strength of the acid derived from the anion portion structure of the second photoacid generator generated by the salt interchange is equal to or less than that of hexafluoroantimonic acid, and the second photoacid generator does not deteriorate the cured product of the photosensitive resin composition compared with the first acid. The curing reaction of the acid-polymerizable compound such as the epoxy resin is mainly conducted by the acid derived from the anion portion structure of the first photoacid generator.

A photoacid generator having a cation portion structure having absorption smaller than that of a cation structure of the first photoacid generator in an exposing wavelength of a negative photosensitive resin is desirably used as the second photoacid generator in view of maintaining the sensitivity of the first photoacid generator.

A preferred example as the second photoacid generator will be shown below.

Preferred cation portion structures of the second photoacid generator will be shown below.

The content of the second photoacid generator in the composition is generally 0.01 to 25% by mass, desirably 0.1 to 20% by mass, and more desirably 0.15 to 15% by mass.

<Amine Compound>

An amine compound refers to a basic compound which contains a nitrogen atom, is derived from the isolated electron pair of nitrogen atoms, and expresses basicity. For example, the amine compound functions to trap an acid derived and generated from an anion portion structure of a photoacid generator. The amine compound can deactivate the acidity of the acid. Thereby, pattern resolution can be improved by controlling a diffusion length of an acid in a process in which the acid is diffused by heat, and sensitivity variation of a photosensitive resin composition solution in a storage period can be suppressed by deactivating a very small quantity of acid generated from a photoacid generator by a dark reaction while the photosensitive resin composition solution is stored.

Examples of the amine compound include guanidine, pyridine, pyrrolidine, indazole, imidazole, pyrazole, pyrazine, pyrimidine, purine, imidazoline, pyrazoline, piperazine, piperidine, or morpholine. These compounds may be substituted. Examples of the substituent group include an amino group, an aminoalkyl group, an alkylamino group, an aminoaryl group, an arylamino group, an alkyl group, an alkoxy group, an acyl group, an allyloxy group, an aryl group, an aryloxy group, a nitro group, a hydroxy group, and a cyano group.

As the amine compound, there can be exemplified tertiary amines such as triphenylamine, triethanolamine, triisopropylamine, triisopropanol amine, N,N-diethyl-3-aminophenol, N-ethyldiethanolamine and 2-diethylaminoethanol; secondary amines such as diethanolamine, diisopropanolamine and N-methylbenzylamine; primary amines such as monomethylamine; diamine such as ethylene diamine; pyrimidine compounds such as aminepyrimidine, 2-aminopyrimidine, 4-aminopyrimidine, and 5-aminopyrimidine, and derivatives thereof; pyridine compounds such as pyridine, methylpyridine and 2,6-dimethylpyridine, and derivatives thereof; and aminophenols such as 2-aminophenol and 3-aminophenol, and derivatives thereof.

Preferred specific examples of the amine compound include guanidine, pyridine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, 2-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, or N-(2-aminoethyl)morpholine.

The amine compounds can be used either singly or in the form of a combination of two or more. The content of the amine compound in all of the composition is desirably 0.001 to 10% by mass, more desirably 0.005 to 5% by mass, and most desirably 0.01 to 4% by mass.

<Sensitizer>

A sensitizer can be used for the purpose of improving sensitivity. For example, when an exposure light source is an i-line, a sensitizer is desirably used, which contains a naphthalene derivative, or anthracene or a derivative thereof, capable of being sensitized to a sulfonium salt type photoacid generator and an iodonium salt type photoacid generator.

<Solvent>

A solvent used for the present invention is not particularly limited. Solvents which have conventionally been known can be used. Examples thereof include γ-butyrolactone, ethyl lactate, propylene carbonate, propylene glycol monomethyl-ether acetate, methyl isobutyl ketone, butyl acetate, methyl amyl ketone, 2-heptanone, ethyl acetate, methyl ethyl ketone, diglyme, xylene, cyclohexanone, and cyclopentanone.

The amount of the solvent can be set to, for example, 5 to 99 parts by mass based on 100 parts by mass of the acid-polymerizable compound, and desirably 10 to 95 parts by mass.

<Method for Manufacturing Liquid Discharge Head>

Figure 2:
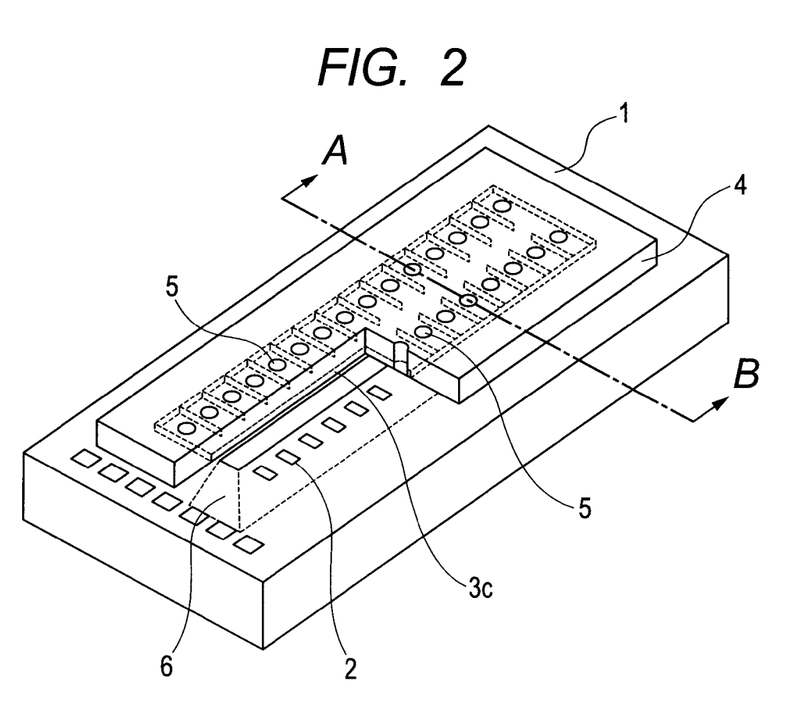
FIG. 2 is a schematic perspective view of a liquid discharge head in the embodiment of the present invention.

FIG. 2 shows an example of a liquid discharge head manufactured using a negative photosensitive resin composition according to the present invention. The example of the liquid discharge head described in FIG. 2 is an ink jet recording head. However, the liquid discharge head is not particularly limited. In the ink jet recording head shown in FIG. 2, an ink flow path forming layer 4 is provided on a substrate 1 having a plurality of energy generating elements 2. The ink flow path forming layer 4 forms an ink discharge port 5 for discharging ink such as a liquid and an ink flow path 3c communicated with the ink discharge port and holding the ink. A supply port 6 supplying the ink to the ink flow path 3c is formed on the substrate 1.

Hereinafter, an embodiment of a method for manufacturing the liquid discharge head of the present invention will be described.

Figure 3:
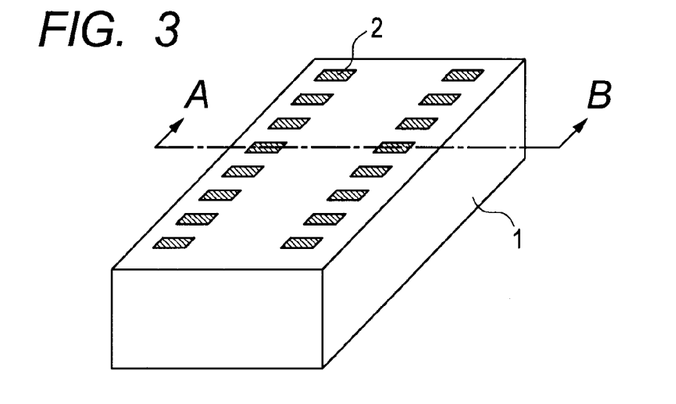
FIG. 3 is a schematic perspective view of a substrate used for the liquid discharge head in the embodiment of the present invention.

As shown in FIG. 3, the plurality of energy generating elements 2 are arranged at a predetermined pitch on the substrate 1. Manufacturing process drawings in sectional views taken in line A-B in FIGS. 2 and 3 are FIGS. 4A to 4F.

Hereinafter, each of processes will be described using FIGS. 4A to 4F. A control signal input electrode (not shown) for operating the energy generating element 2 is connected to the energy generating element 2.

Figure 4A:
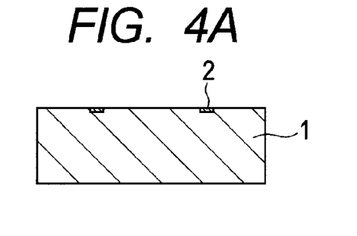
FIGS. 4A, 4B, 4C, 4D, 4E and 4F are process sectional views for describing a manufacturing process of the liquid discharge head in the embodiment of the present invention.

First, as shown in FIG. 4A, the substrate 1 having the energy generating elements 2 is prepared. The substrate 1 is desirably a Si substrate. The substrate 1 is particularly desirably a silicon single crystal. When a through hole is bored in the substrate 1 by anisotropic etching, the substrate 1 is desirably a silicon single crystal having crystal orientation <100>. When the through hole is bored in the substrate 1 by dry etching, sandblasting, and laser, the substrate 1 may be a silicon single crystal having crystal orientation <110>.

If the energy generating element 2 applies discharge energy for discharging ink droplets to the ink to enable the discharge of the ink droplets from the discharge port 5, the energy generating element 2 is not particularly limited. For example, when a heating resistor element is used as the energy generating element 2, the heating resistor element heats the ink which is in the vicinity of the heating resistor element to bring about the state change of the ink, thereby generating the discharge energy.

Figure 4B:
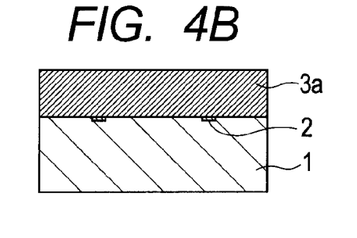

As shown in FIG. 4B, a dissolvable resin composition is then coated on the substrate 1 to form an ink flow path pattern layer 3a. In a method for forming the ink flow path pattern layer 3a, for example, a positive photosensitive resin is suitably dissolved in a solvent, and the obtained solution is coated on the substrate 1 by a spin coat method. The ink flow path pattern layer 3a can be then formed by heating. Although the thickness of the ink flow path pattern layer 3a is a desired height of the ink flow path 3c, and is not particularly limited, the thickness is desirably, for example, 2 to 50 µm.

Figure 4C:
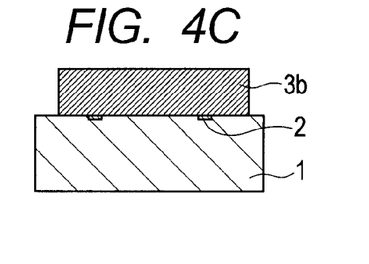

As shown in FIG. 4C, the ink flow path pattern layer 3a is irradiated with radiation rays and developed to form an ink flow path pattern 3b.

The ink flow path forming layer 4 made of a photosensitive resin composition of the present invention is then formed on the ink flow path pattern 3b and the substrate 1. The thickness of the ink flow path forming layer 4 is desirably equal to or greater than 2 µm as a thickness on the ink flow path pattern 3b. As far as the developability of the discharge port is not impaired, the thickness of the ink flow path forming layer 4 is not particularly limited. For example, the thickness is desirably 100 µm or less as the thickness on the ink flow path pattern 3b.

Figure 4D:
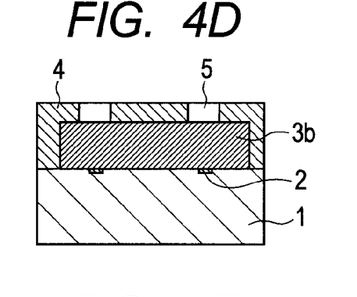

As shown in FIG. 4D, the ink flow path forming layer 4 is then irradiated with radiation rays such as an i-line wavelength. The ink flow path forming layer 4 can be irradiated with a required exposure amount calculated in the sensitivity evaluation. The ink flow path forming layer 4 is then developed by methyl isobutyl ketone (MIBK) to form the discharge port 5.

Figure 4E:
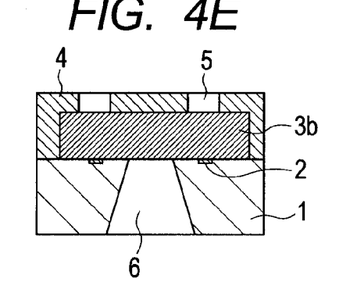

As shown in FIG. 4E, the supply port 6 is then formed using suitable methods such as etching processing.

Figure 4F:
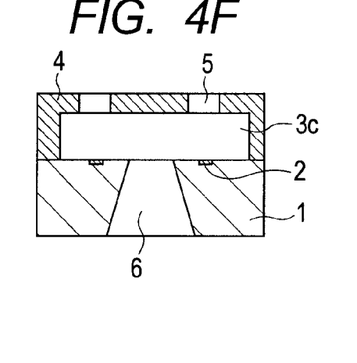

As shown in FIG. 4F, the ink flow path pattern 3b is then dissolved in a suitable solvent to remove the ink flow path pattern 3b. The suitable solvent as described herein may be an alkaline aqueous solution or an organic solvent. Furthermore, in order to cure the ink flow path forming layer 4, the ink flow path forming layer 4 is post-baked at 200° C. for 1 hour using, for example, an oven.

The substrate 1 is then cut and separated into chips by a dicing saw. In order to drive the energy generating element 2, an inner lead (not shown) formed on a flexible substrate (not shown) and an electrode pad (not shown) formed on the substrate 1 are electrically connected. When an electrical connecting process is conducted by a single point bonding system, the substrate is generally subjected to a temperature of about 200° C. or equal to or greater than 200° C. Furthermore, a chip tank member for supplying ink is connected to complete a liquid discharge head (not shown).

The above-described method is not limited to the method for manufacturing the liquid discharge head, and is effective also as a pattern forming method for forming a hollow pattern.

The ink jet recording head was described as an example of application of the present invention in the above-described description. However, the range of application of the present invention is not limited thereto. The present invention can be applied also to manufacture of liquid discharge heads for biochip production and electronic circuit printing applications. Examples of the liquid discharge head include a head for manufacturing color filter in addition to the ink jet recording head.

EXAMPLES

Hereinafter, Examples of the present invention will be described. However, the present invention is not limited to these Examples. In the Examples, an i-line wavelength was used for exposure of a negative photosensitive resin composition.

Examples 1 to 4, Comparative Examples 1 and 2

Photosensitive resin compositions were obtained according to formulations described in Table 1. 100 g of a polyfunctional epoxy resin and 60 g of xylene as a solvent were blended. A first and second photoacid generators of molar numbers described in Table 1 were added to the polyfunctional epoxy resin solution. In Examples 1 and 2, the first and second photoacid generators were prepared so that the molar amount of the second photoacid generator was three times greater than that of the first photoacid generator. In Example 3, the first and second photoacid generators were prepared so that the molar amount of the second photoacid generator was equal to that of the first photoacid generator. In Example 4, the first and second photoacid generators were prepared so that the molar amount of the second photoacid generator was two times greater than that of the first photoacid generator.

Triethanolamine was used as an amine compound (D) to be added.

Comparative Example 1 shows an example when only the first photoacid generator is used. Comparative Example 2 shows an example when only the second photoacid generator is used.

<Evaluation Method>

Figure 1:
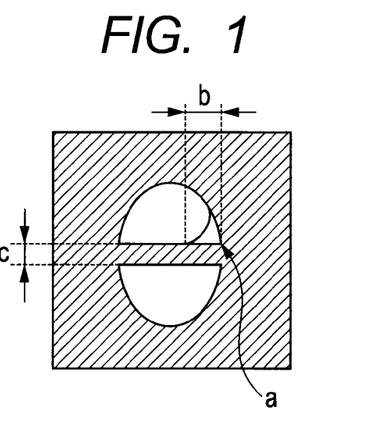
FIG. 1 is a schematic view of a pattern used in order to evaluate molding accuracy in an embodiment of the present invention.

Sensitivity and molding accuracy were evaluated using a model pattern (FIG. 1) in an aperture diameter of an ellipsoidal nozzle opening. The ellipsoidal nozzle opening had a design size having a long axis of 20 μm and a short axis of 16 μm. The model pattern was bridged by a line pattern having a width of 3 μm along the short axis. Exposure was gradually conducted in a range of 500 J/m$^2$ to 20000 J/m$^2$ by using the model pattern as evaluation of sensitivity to form a negative resist pattern. An exposure amount required to form the pattern having the above-described design size was measured.

Furthermore, in evaluation of molding accuracy, a part where the above-described ellipsoid and the bridged line pattern (symbol c in FIG. 1) crossed each other was observed by a scanning electron microscope (SEM), and resolution thereof was measured. A distance (symbol b in FIG. 1) between a half-moon shaped end part (symbol a in FIG. 1) when a resist pattern could be formed so as to faithfully follow a mask pattern and a part where the bridged line pattern and the actually resolved pattern crossed each other was defined as molding accuracy (unit: μm). This means the molding accuracy of 0 μm when the actual pattern is resolved to the half-moon shaped end part (symbol a in FIG. 1). That is, this shows that the actual pattern coincides to the design size of the mask. However, when the molding accuracy is deteriorated, a negative product is left in the half-moon shaped end part. The spread extent of the negative product determines the value of the molding accuracy.

Heat resistance was evaluated as follows. The liquid discharge head produced by the manufacturing method described above was immersed in ink. The liquid discharge head was stored in the ink at 60° C. for one month. The heat resistance was evaluated by a liquid contact test for confirming peeling of a flow path forming layer and a substrate of the stored liquid discharge head. The heat resistance of each of five heads per each level was evaluated. If the flow path forming layer which is a cured product of a photosensitive resin is deteriorated when the photosensitive resin composition is used for the liquid discharge head, a liquid penetrates in the deteriorated part to reduce adhesion between the flow path forming layer and the substrate, thereby, peeling occurs between the flow path forming layer and the substrate.

The photosensitive resin composition was applied on a support including a silicon wafer by a spin coater. The photosensitive resin composition was then dried by prebaking at 90° C. for 5 minutes to obtain a photosensitive resin composition layer having a film thickness of 20 μm. The photosensitive resin composition layer was then pattern-exposed via a mask having a desired depicting pattern using "FPA-3000 i5+" (i line stepper: trade name, manufactured by Canon, Inc.), and PEB was conducted at 90° C. for 4 minutes by a hot plate. After the PEB, development processing was conducted using "CDS-630+" (trade name, manufactured by Canon, Inc.). The developed resin pattern was then post-baked with the substrate at 150° C. for 1 hour using an oven to obtain a cured resist pattern formed on the support. Furthermore, the resist pattern was heat-treated at 200° C. for 1 hour using an oven. The heat resistance was evaluated using this sample.

TABLE 1

|  |  | Ex. 1 | Ex. 2 | Ex. 3 | Ex. 4 | Com. Ex. 1 | Com. Ex. 2 |
| --- | --- | --- | --- | --- | --- | --- | --- |
| Resin component | A-1 (g) | 100 | 100 | 100 | 100 | 100 | 100 |
| First photoacid generator | B-1 (mol) | 0.0008 | 0.0008 | 0.0008 | 0.0008 | 0.0008 |  |
| Second photoacid generator | C-1 (mol) | 0.0024 | 0.0024 | 0.0008 | 0.0016 |  | 0.0024 |
| Amine compound | D (g) | 0.05 | 0 | 0.05 | 0.05 | 0.05 | 0 |
| Exposure amount (J/m$^2$) |  | 4000 | 1500 | 4000 | 4000 | 4000 | 4500 |
| Molding accuracy (μm) |  | <0.5 | 2.0 | 1.0 | 1.0 | 1.0 | 4.0 |
| Evaluation of heat esistance (number of heads having occurrence of peeling) |  | 0 | 0 | 3 | 1 | 5 | 0 |

(A-1): EHPE 3150 (trade name, manufactured by Daicel Chemical Industries, Ltd.)
(B-1): GSID26-1 (trade name, manufactured by Ciba Japan K.K)
(C-1): SP172 (trade name, manufactured by ADEKA Corporation)
(D): triethanolamine Examples 1 and 2 contained the first photoacid generator and the second photoacid generator, and the model pattern was formed using the polyfunctional epoxy resin. The pattern could be formed with a small exposure amount of equal to or less than 4000 J/m². The molding accuracy in this case was fine one of equal to or less than 2.0 μm. Furthermore, also in the evaluation of the heat resistance, the peeling of the flow path forming layer and the substrate was not confirmed. Even when Examples 1 and 2 were used as the liquid discharge head, a reliable flow path forming layer could be formed. Example 1 in which an amine component was blended provided a better result of molding accuracy than that of Example 2. The reason is considered to be as follows. The blended amine compound controlled diffusion of a generating acid in a process for diffusing the acid generated by exposure during heating, to improve pattern resolution.

On the other hand, when only the first photoacid generator was used as in Comparative Example 1, a micropattern having molding accuracy of equal to or less than 2.0 μm could be formed. However, in the evaluation of the heat resistance, peeling occurred. This reason is considered to be as follows. When a strong acid derived from an anion portion structure of the first photoacid generator is left in a cured film of the photosensitive resin composition, the acid decomposes a resin component and a polymer substance during heat processing conducted at 200° C.

When only the second photoacid generator was used as in Comparative Example 2, in the evaluation of the heat resistance, no peeling occurred. However, molding accuracy was 4 μm, and a microscopic shape could not be formed. This result of the evaluation of the heat resistance shows that if an acid strength of an acid derived from an anion portion structure of the second photoacid generator is equal to or less than that of hexafluoroantimonic acid, the acid does not deteriorate a cured product of a photosensitive resin.

Furthermore, in Examples 3 and 4, the first photoacid generator and the second photoacid generator were used so that addition molar ratios of the first photoacid generator and the second photoacid generator were set to 1:1 and 1:2. In both Examples 3 and 4, molding accuracy was 1 μm and good. In the evaluation of the heat resistance, some peelings occurred. However, the heat resistance of Examples 3 and 4 was improved compared with Comparative Examples. Example 4 having the increased additive amount of the second photoacid generator decreased the generating number of peelings compared with Example 3. The reason is considered to be as follows. Example 4 uses a larger amount of the second photoacid generator to more effectively conduct salt interchange of a first acid derived from the anion portion structure of the first photoacid generator and the second photoacid generator. Thereby, the first acid left in the cured film of the photosensitive resin composition is reduced to improve the heat resistance. From these results, in view of more effectively generating the salt interchange, the second photoacid generator of equal to or greater than 3 equivalent of the first photoacid generator is desirably added.

Furthermore, a water repellent layer may be formed on the flow path forming layer formed using the photosensitive resin composition of the present invention, while the water repellent layer is not described in the examples. The water repellent layer requires water repellence for ink and mechanical strength against wiping accompanied by contact with a wiper. Therefore, a negative resist containing a functional group having water repellence such as fluorine and silicon, and a condensate containing a hydrolyzable silane compound having a fluorine-containing group and a hydrolyzable silane compound having a cation polymerizable group are suitably used as the material of the water repellent layer. For example, the water repellent layer is provided after application and heat processing of the photosensitive resin composition, and can be patterned simultaneously with exposure of the photosensitive resin composition.

Examples 5 and 6

Examples using one kind of epoxy resin are shown in Examples 5 and 6. A plurality of kinds of epoxy resins may be used upon being mixed together in order to satisfy required characteristics such as coating properties and viscosity adjustment of a photosensitive resin composition.

Photosensitive resin compositions were obtained according to formulations described in Table 2. The blended amounts of polyfunctional epoxy resins of Examples 5 and 6 were calculated from epoxy equivalent (WPE) so that an epoxy content was equal to the case of 100 g of the polyfunctional epoxy resin of Example 1. The masses of the polyfunctional epoxy resins described in Table 2 and 60 g of xylene as a solvent were blended. A first and second photoacid generators of molar amounts described in Table 2 were added to a polyfunctional epoxy resin solution.

TABLE 2

|  |  | WPE | Ex. 1 | Ex. 5 | Ex. 6 |
|---|---|---|---|---|---|
| Resin components | A-1 (g) | 178 | 100 | | |
|  | A-2 (g) | 210 | | 118 | |
|  | A-3 (g) | 208 | | | 117 |
| First photoacid generator | B-1 (mol) | | 0.0008 | 0.0008 | 0.0008 |
| Second photoacid generator | C-1 (mol) | | 0.0024 | 0.0024 | 0.0024 |
| Amine component | D (g) | | 0.05 | 0.05 | 0.05 |
| Exposure amount (J/m²) | | | 4000 | 4000 | 4000 |
| Molding accuracy (μm) | | | <0.5 | <0.5 | <0.5 |
| Evaluation of heat resistance (number of heads having occurrence of peeling) | | | 0 | 0 | 0 |

(A-1): EHPE 3150 (trade name, manufactured by Daicel Chemical Industries, Ltd.)
(A-2): JER157S70 (trade name, manufactured by Japan Epoxy Resins Co., Ltd.)
(A-3): EPICLON N-865 (trade name, manufactured by Dainippon Ink and Chemicals Inc.)
(B-1): GSID26-1 (trade name, manufactured by Ciba Japan K.K)
(C-1): SP172 (trade name, manufactured by ADEKA Corporation)
(D): triethanolamine The photosensitive resin compositions were evaluated in the same manner as in Example 1.

In both Examples 5 and 6, patterns could be formed with an exposure amount of equal to or less than 4000 J/m² as in Example 1. Molding accuracy in this case was smaller than 0.5 μm and good. Also in the evaluation of the heat resistance, peeling of a flow path forming layer and a substrate was not confirmed, and a reliable flow path forming layer could be formed.

The application field of the present invention is not particularly limited. For example, the present invention is applicable to manufacture of the semiconductor integrated circuit, the semiconductor exposing mask, and the MEMS. Particularly, the liquid discharge head of the MEMS field has high heat resistance, and the discharge port can be formed with high sensitivity and good molding accuracy in the manufacture of the liquid discharge head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-024683, filed Feb. 5, 2010, which is hereby incorporated by reference herein in its entirety.

The invention claimed is:

1. A photosensitive resin composition comprising:
a cation polymerizable compound; and
a photoacid generator having an anion portion represented by a chemical formula 1 and a cation represented by a chemical formula 4, (Chemical Formula 1)

wherein R represents a hydrocarbon group which may be substituted with a fluorine atom and has a total carbon number of 1 to 30; X is selected from the group consisting of a carbon atom and a phosphorous atom; Y is selected from the group consisting of —S(=O)$_2$—, —O—CF$_2$—, —C(=O)—CF$_2$—, —O—C(=O)—CF$_2$—, —C(=O)—O—CF$_2$—, and a single bond; R has at least one fluorine atom when Y is —S(=O)$_2$— or the single bond; m and n are integers selected from the group consisting of m+n=3 and n=0, 1, and 2 when X is the carbon atom; m and n are integers selected from the group consisting of m+n=6 and n=0 to 5 when X is the phosphorous atom; and R and Y may be different from each other when m is equal to or greater than 2;

(Chemical Formula 4)

wherein R$_1$ to R$_3$ represent an aryl group having a total carbon number of 6 to 30, a heterocyclic group having a total carbon number of 4 to 30, an alkyl group having a total carbon number of 1 to 30, an alkenyl group having a total carbon number of 2 to 30, or an alkynyl group having a total carbon number of 2 to 30, R$_1$ to R$_3$ have at least two oxygen atoms included in the total component atoms; and
a salt of the anion portion and the cation portion, wherein an acid strength of an acid derived from the anion portion is equal to or less than that of hexafluoroantimonic acid.

2. The photosensitive resin composition according to claim 1, wherein a molar number of the salt in the photosensitive resin composition is equal to or greater than three times that of the photoacid generator.

3. The photosensitive resin composition according to claim 1, wherein the cation polymerizable compound has one of an epoxy group and an oxetane group.

4. The photosensitive resin composition according to claim 1, wherein the cation polymerizable compound is a novolak epoxy resin.

5. The photosensitive resin composition according to claim 1, wherein the cation polymerizable compound is a polyfunctional epoxy resin having an alicyclic skeleton.

6. The photosensitive resin composition according to claim 1, wherein the anion portion of the photoacid generator has a structure represented by the following formula:

7. The photosensitive resin composition according to claim 1, wherein the anion portion of the photoacid generator has a structure represented by the following formula:

8. A method for manufacturing a structural body comprising in this order:
preparing a substrate having the photosensitive resin composition of claim 1 provided thereon, the photosensitive resin composition constituting the structural body;
exposing the photosensitive resin composition to cure an exposed portion thereof, thereby forming a cured product thereof, and removing an uncured portion; and
heating the cured product to 160° C. or higher.

9. A liquid discharge head comprising:
a discharge port member having a discharge port for discharging liquid,
wherein the discharge port member comprises a cured product of a resin composition,
the resin composition comprising:
a cation polymerizable compound;
a photoacid generator having an anion portion represented by a chemical formula 1 and a cation portion represented by a chemical formula 4, (Chemical Formula 1)

wherein R represents a hydrocarbon group which may be substituted with a fluorine atom and has a total carbon number of 1 to 30; X is selected from the group consisting of a carbon atom and a phosphorous atom; Y is selected from the group consisting of —S(=O)$_2$—, —O—CF$_2$—, —C(=O)—CF$_2$—, —O—C(=O)—CF$_2$—, —C(=O)—O—CF$_2$—, and a single bond; R has at least one fluorine atom when Y is —S(=O)$_2$— or the single bond; m and n are integers selected from the group consisting of m+n=3 and n=0, 1, and 2 when X is the carbon atom; m and n are integers selected from the group consisting of m+n=6 and n=0 to 5 when X is the phosphorous atom; and R and Y may be different from each other when m is equal to or greater than 2;

(Chemical Formula 4)

wherein R$_1$ to R$_3$ represent an aryl group having a total carbon number of 6 to 30, a heterocyclic group having a total carbon number of 4 to 30, an alkyl group having a total carbon number of 1 to 30, an alkenyl group having a total carbon number of 2 to 30, or an alkynyl group having a total carbon number of 2 to 30, $R_1$ to $R_3$ have at least two oxygen atoms included in the total component atoms; and a salt of the anion portion and the cation portion, wherein an acid strength of an acid derived from the anion portion is equal to or less than that of hexafluoroantimonic acid.

10. The liquid discharge head according to claim 9, wherein a molar number of the salt in the photosensitive resin composition is equal to or greater than three times that of the photoacid generator.

11. The liquid discharge head according to claim 9, wherein the cation polymerizable compound has one of an epoxy group and an oxetane group.

12. The liquid discharge head according to claim 9, wherein the cation polymerizable compound is a novolak epoxy resin.

13. The liquid discharge head according to claim 9, wherein the cation polymerizable compound is a polyfunctional epoxy resin having an alicyclic skeleton.

14. The liquid discharge head according to claim 9, wherein the anion portion of the photoacid generator has a structure represented by the following formula:

15. The liquid discharge head according to claim 9, wherein the anion portion of the photoacid generator has a structure represented by the following formula:

* * * * *